United States Patent
Shibata et al.

(10) Patent No.: US 6,815,867 B2
(45) Date of Patent: Nov. 9, 2004

(54) SUBSTRATE USABLE FOR AN ACOUSTIC SURFACE WAVE DEVICE, A METHOD FOR FABRICATING THE SAME SUBSTRATE AND AN ACOUSTIC SURFACE WAVE DEVICE HAVING THE SAME SUBSTRATE

(75) Inventors: Tomohiko Shibata, Kasugai (JP); Yukinori Nakamura, Nagoya (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 145 days.

(21) Appl. No.: 09/997,997

(22) Filed: Nov. 30, 2001

(65) Prior Publication Data

US 2002/0070636 A1 Jun. 13, 2002

(30) Foreign Application Priority Data

Dec. 5, 2000 (JP) ........................................ 2000-370520
Sep. 4, 2001 (JP) ........................................ 2001-267265

(51) Int. Cl.$^7$ ........................... H01L 41/08; H03H 9/25; H03H 9/64
(52) U.S. Cl. ............................. 310/313 A; 310/313 R; 333/150; 333/152; 333/153; 333/154; 333/155; 257/84; 340/825.69
(58) Field of Search ........................ 310/313 A, 313 R; 333/150–155

(56) References Cited

U.S. PATENT DOCUMENTS 5,061,870 A * 10/1991 Ieki et al. ............... 310/313 A
5,497,920 A * 3/1996 Moeller et al. ............. 224/414
5,905,449 A * 5/1999 Tsubouchi et al. ..... 340/825.69
6,275,123 B1 * 8/2001 Tanaka et al. .............. 333/193
6,610,144 B2 * 8/2003 Mishra et al. ................ 257/84

OTHER PUBLICATIONS

S. Kaneko, et al, *"Epitaxial Growth of AlN Film by Low–pressure MOCVD in Gas–Beam–Flow Reactor,"* Journal of Crystal Growth, 115(1991), pp. 643–647.

* cited by examiner

Primary Examiner—Thomas M. Dougherty
Assistant Examiner—J. Aguirrechea
(74) Attorney, Agent, or Firm—Burr & Brown

(57) ABSTRACT

A base material made of C-faced sapphire single crystal is set on a susceptor installed in a reactor arranged horizontally. Then, a trimethyl-aluminum and an ammonia are introduced as raw material gases into the reactor and supplied onto the substrate, to form an AlN film. In this case, the temperature of the base material is set to 1100° C. or over, and the ratio (V raw material gas/III raw material gas) is set to 800 or below, and the forming pressure is set within a range of 7–17 Torr. As a result, the crystallinity of the AlN film is developed to 90 arcsec or below in FWHM of X-ray rocking curve, and the surface flatness of the AlN film is developed to 20 Å or below. Therefore, a substrate composed of the base material and the AlN film is preferably usable for an acoustic surface wave device, and if the substrate is employed, the deviation from the theoretical propagation velocity is set to 1.5 m/sec or below.

4 Claims, 6 Drawing Sheets

SUBSTRATE USABLE FOR AN ACOUSTIC SURFACE WAVE DEVICE, A METHOD FOR FABRICATING THE SAME SUBSTRATE AND AN ACOUSTIC SURFACE WAVE DEVICE HAVING THE SAME SUBSTRATE

BACKGROUND OF THE INVENTION (1) Field of the Invention

This invention relates to a substrate usable for an acoustic surface wave device which includes a base material made of C-faced sapphire single crystal and an AlN film formed on the base material by a metal organic chemical vapor deposition (MOCVD) method using trimethylaluminum and ammonia as raw material gases. This invention also relates to a method for fabricating the same substrate, and an acoustic surface wave device having the same substrate.

(2) Related Art Statement

An AlN film can be made on a base material of C-faced sapphire single crystal by an MOCVD method under a lower pressure using trimethylaluminum and ammonia as raw material gases, as disclosed in "Journal of Crystal Growth", 115(1991), pp.643–647. Such an AlN film serves as a buffer layer, and the thus obtained substrate made of the base material and the AlN film may be preferably usable for an acoustic surface wave device because the AlN film has a larger band width of 6.2 eV, a higher heat conductivity and a thermal expansion coefficient similar to the one of Si or GaAs.

In the above document, concretely, the AlN film is made as follows. First of all, a C-faced sapphire substrate is set on a susceptor installed in a reactor, and heated to 1200° C. Then, a trimethylaluminum and an ammonia are introduced as raw material gases with a carrier gas composed of hydrogen gas into the reactor and supplied onto the substrate, to form the AlN film oriented in the C-axis through the reaction between the raw material gases. The ratio (ammonia/trimethylaluminum) is set to $2 \times 10^4$.

As mentioned above, the substrate composed of the AlN film and the base material of C-faced sapphire single crystal exhibits excellent performance as a substrate of an acoustic surface wave device, but has relatively poor surface flatness. Therefore, the substrate cannot be practically usable for the acoustic surface wave device as is. For practical use, the substrate is required to be polished. As a result, the fabricating process of the substrate is made complicated, and the fabricating cost of the substrate is increased.

Moreover, since the ratio (ammonia/trimethylaluminum) is set to $2 \times 10^4$ it is difficult to control the fabricating condition, so that the crystal quality of the AlN film is deteriorated. For example, the full width at half maximum (FWHM) in X-ray rocking curve of the AlN film is more than 100 arcsec, and thus, the substrate having such a low quality AlN film is not practically usable for an acoustic surface wave device.

SUMMARY OF THE INVENTION

It is an object of the present invention to work out the above conventional problems, and thus, to provide a substrate usable for an acoustic surface wave device which has excellent surface flatness, in addition to excellent crystal quality. It is another object of the present invention to provide a method for fabricating the same substrate stably without polishing and an acoustic surface wave device having the same substrate.

In order to achieve the above object, this invention relates to a substrate usable for an acoustic surface wave device, including a base material made of C-faced sapphire single crystal, and an AlN film having crystallinity of 90 arcsec or below in FWHM of X-ray rocking curve and a surface flatness of 20 Å or below which is formed by an MOCVD method using trimethylaluminum and ammonia as raw material gases.

This invention also relates to a method for fabricating a substrate usable for an acoustic surface wave device, including the steps of preparing a base material made of C-faced sapphire single crystal, and forming, on the base material, an AlN film on the condition that the temperature of the base material is set to 1100° C. or over, and the ratio (V raw material gas/III raw material gas) is set to 800 or over.

In a preferred embodiment of the fabricating method of the present invention, the AlN film is formed under a pressure of 7-17 Torr.

Moreover, in another preferred embodiment of the present invention, the main surface of the base material made of C-faced sapphire single crystal on which the AlN film is formed is nitrided, to form a surface nitride layer at the main surface, and then, the AlN film is formed on the main surface via the surface nitride layer.

Moreover, this invention relates to an acoustic surface wave device, including a substrate composed of a base material made of C-faced sapphire single crystal and an AlN film, formed on the base material, having crystallinity of 90 arcsec or below in FWHM of X-ray rocking curve and a surface flatness of 20 Å or below, and inter-digital type electrodes.

In the above acoustic surface wave device, it is desired that the main surface of the base material made of the C-faced sapphire single crystal as a constituent portion is nitrided to form a surface nitride layer at the main surface, and the AlN film is formed on the main surface via the surface nitride layer.

BRIEF DESCRIPTION OF THE DRAWINGS

For better understanding of the present invention, reference is made to the attached drawings, wherein.

DETAILED DESCRIPTION OF THE INVENTION

Figure 1:
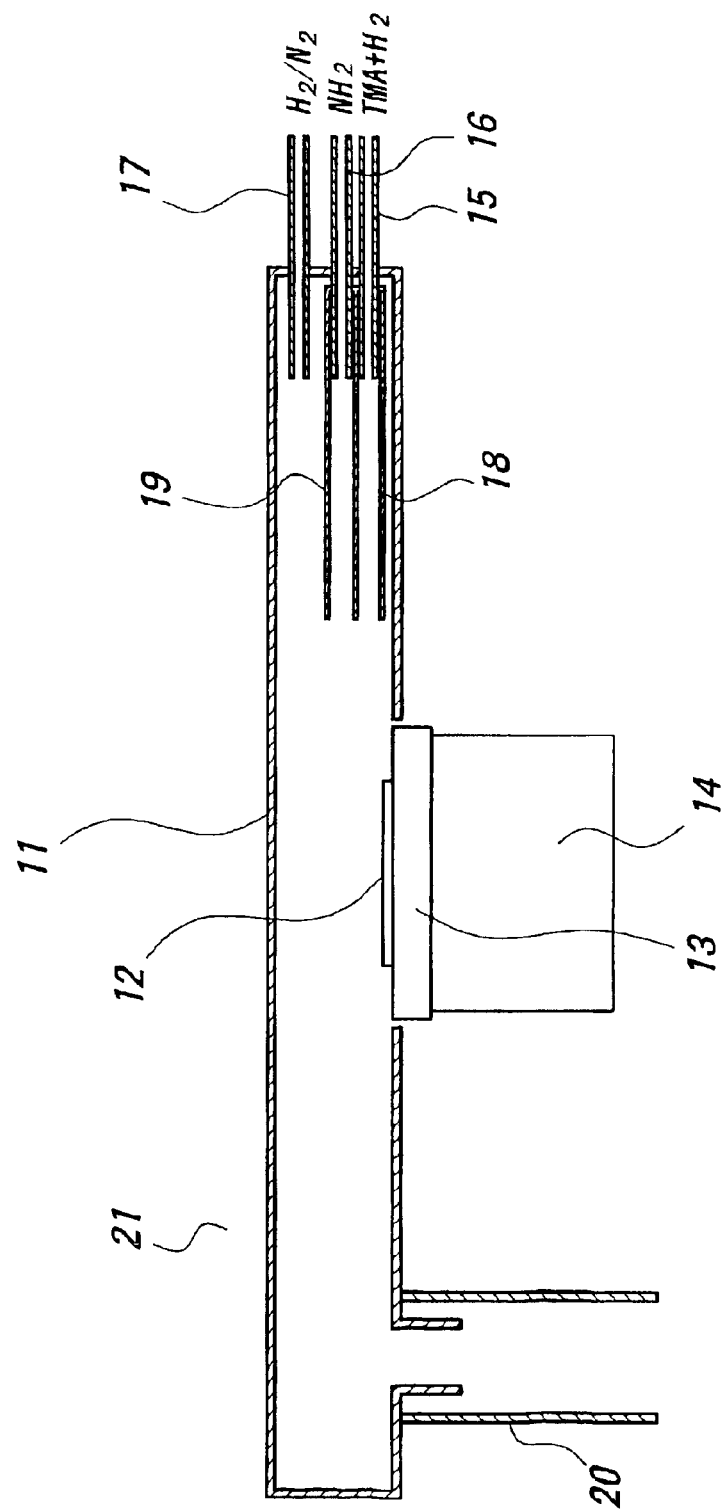
FIG. 1 is a cross sectional view schematically showing an apparatus for fabricating a substrate usable for an acoustic surface wave device according to the present invention.

FIG. 1 is a cross sectional view schematically showing an apparatus for fabricating a substrate usable for an acoustic surface wave device according to the present invention. The fabricating apparatus depicted in FIG. 1 includes a reactor 11 set horizontally and a susceptor 13 located at the almost center of the bottom wall of the reactor 11. Then, a heater 14 is provided under the susceptor 13. A base material 12 made of sapphire single crystal substrate is set and held on the susceptor 13 upwardly, and heated with the heater 14 to a given temperature via the susceptor 13. The susceptor 13 may be provided at the top wall of the reactor, and the base material 12 may be set on the susceptor 13 downwardly.

At the right side of the reactor 11 are provided gas inlets 15–17 to introduce raw material gases with a carrier gas. A trimethylaluminum gas is introduced with a hydrogen carrier gas from the first gas inlet 15, and an ammonia gas is introduced from the second gas inlet 16. Then, a carrier gas composed of a hydrogen gas and a nitrogen gas is introduced from the third gas inlet 17. The introduced trimethylaluminum gas and the introduced ammonia gas are also introduced into the center region of the reactor through separated guiding tubes 18 and 19, respectively. In this case, the raw material gases are effectively supplied onto the substrate 12, and not supplied in the remote region from the substrate 12. Therefore, the introduced raw material gases are consumed by an MOCVD reaction on the substrate. Moreover, at the left side of the reactor 11 is provided a ventilation duct 20, and the remaining raw material gases not consumed are exhausted from the ventilation duct 20.

Figure 2:
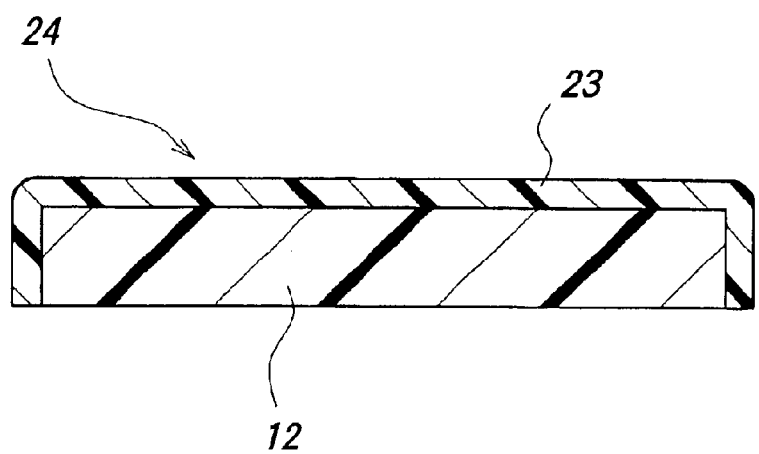
FIG. 2 is a cross sectional view showing a substrate usable for an acoustic surface wave device according to the present invention.

The base material 12 is heated to 1100° C. or over with the heater 14, and the interior pressure of the reactor 11 is set within a range of 7-17 Torr. Then, the ratio (ammonia/trimethylaluminum), that is, the ratio (V raw material gas/III raw material gas), is set to 800 or below. In this case, as shown in FIG. 2, an AlN film 23 can be formed in a thickness of 0.5 µm or over, particularly within a range of 1–3 µm on the base material 12. Since the surface flatness of the AlN film 23 is 20 Å or below in Ra and the crystallinity of the AlN film 23 is 90 arcsec in FWHM of X-ray rocking curve, the resulting substrate 24 is preferably usable for an acoustic surface wave device. Herein, the AlN 23 serves as a piezoelectric substance in the acoustic surface wave device.

Generally, the crystallinity of a film is developed as the thickness of the film is increased. However, since the film is formed too thick, the film is broken away and some cracks are created in the film. Therefore, it is desired in the present invention that the AlN film is formed in a thickness of the above range to prevent the breakaway and the crack creation. Within the above range thickness, the crystallinity of the AlN film can be easily developed to 90 arcsec in FWHM of X-ray rocking curve.

The AlN film 23 may include an additive element such as Ge, Si, Mg, Zn, Be, P or B as occasion demands. Moreover, the AlN film may include a minute impurity contained in the raw material gases and the reactor or contained dependent on the forming condition.

Figure 3:
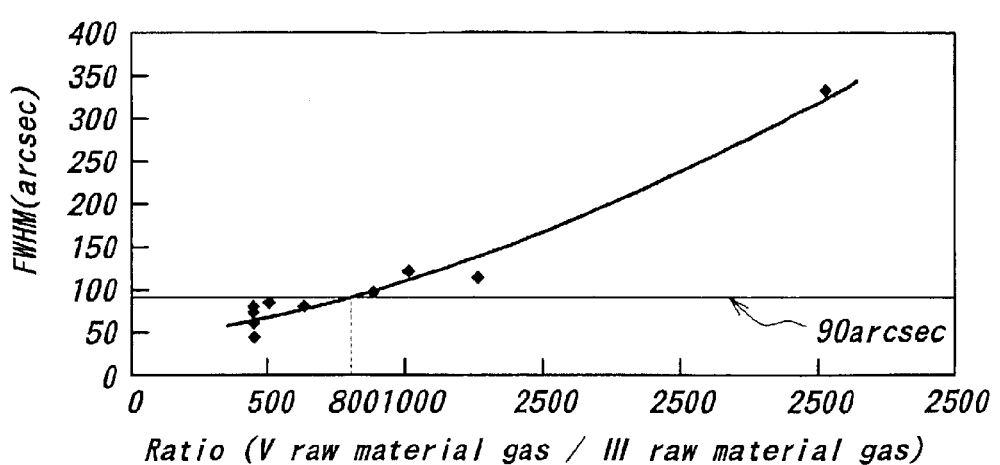
FIG. 3 is a graph showing, in forming an AlN film, the relation between a ratio of (V raw material gas/III raw material gas) and the FWHM in X-ray rocking curve.

FIG. 3 is a graph showing, in forming an AlN film, the relation between a ratio (V raw material gas/III raw material gas) and the FWHM in X-ray rocking curve. The abscissa axis designates the ratio (ammonia/trimethylaluminum), and the vertical axis designates the FWHM. If the FWHMs of AlN films are set to 90 arcsec or below, the resulting substrates having their respective AlN films are preferably usable as substrates for acoustic surface wave device. On the other hand, if the FWHMs of AlN films are set beyond 90 arcsec, the resulting substrates having their respective AlN films are not usable as substrates for acoustic surface wave devices. Therefore, as is apparent from FIG. 3. it is desired that the ratio of (ammonia/trimethylaluminum), that is, the ratio (V raw material gas/III raw material gas), is set to 800 or below.

Figure 4:
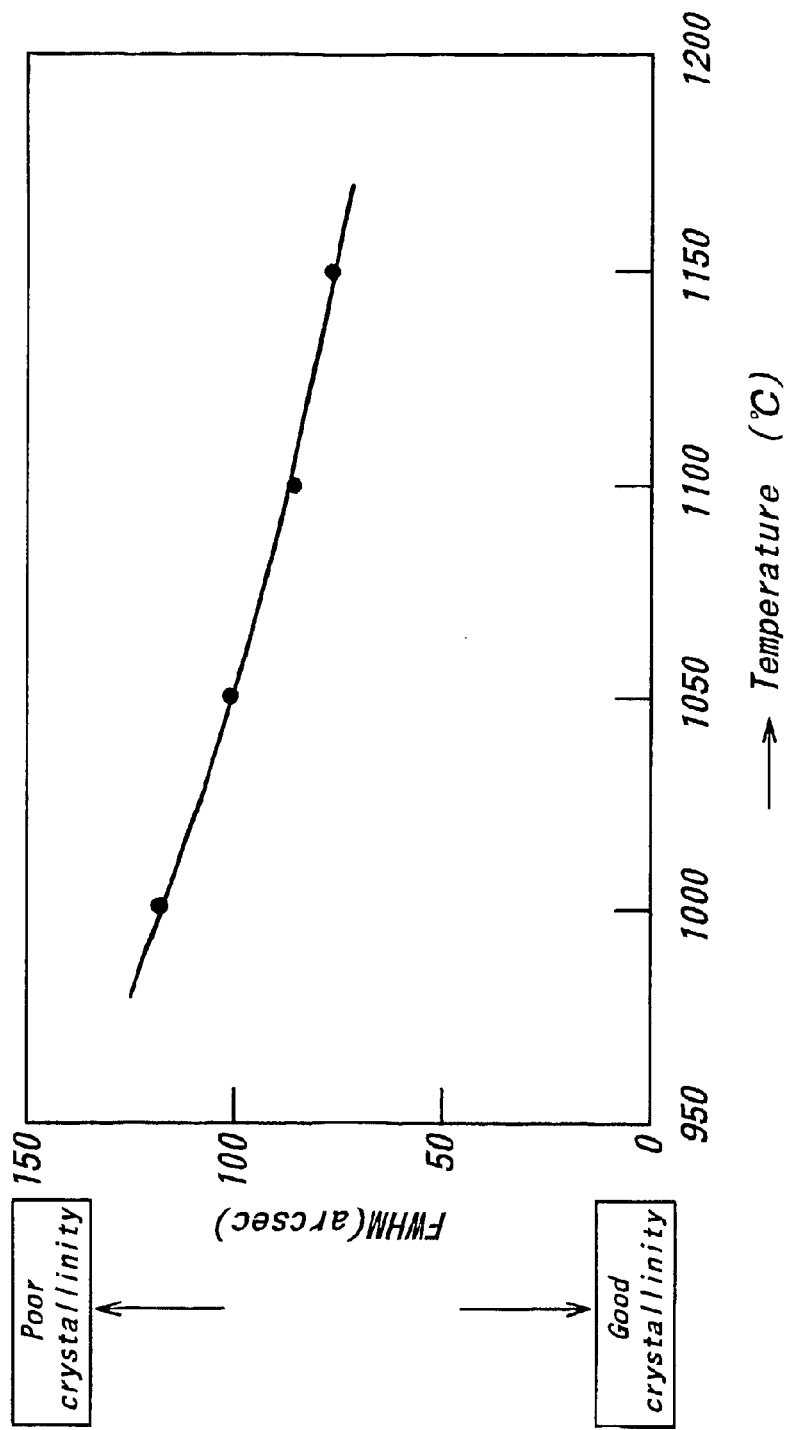
FIG. 4 is a graph showing, in forming an AlN film, the relation between the temperature of a heated substrate and the FWHM in X-ray rocking curve.

FIG. 4 is a graph showing, in forming an AlN film, the relation between the temperature of a heated substrate and the FWHM in X-ray rocking curve. The abscissa axis designates temperature of the base material, and the vertical axis designates the FWHM. As is apparent from FIG. 4, as the temperature of the base material is increased, the crystallinity of the AlN film is developed. Since it is required that the crystallinity of the AlN film is 90 arcsec or below in FWHM of X-ray rocking curve for practical use of an acoustic surface wave device, it is desired that the temperature of the base material is set to 1100° C. or over.

Moreover, the forming pressure of the AlN film is preferably set within a range of 7–17 Torr. That is, the interior pressure of the reactor is set to the above range. In this case, even though the ratio of (ammonia/trimethylaluminum) is largely fluctuated, the crystallinity of the AlN film can be easily developed to 90 arcsec or below in FWHM of X-ray rocking curve.

Figure 5:
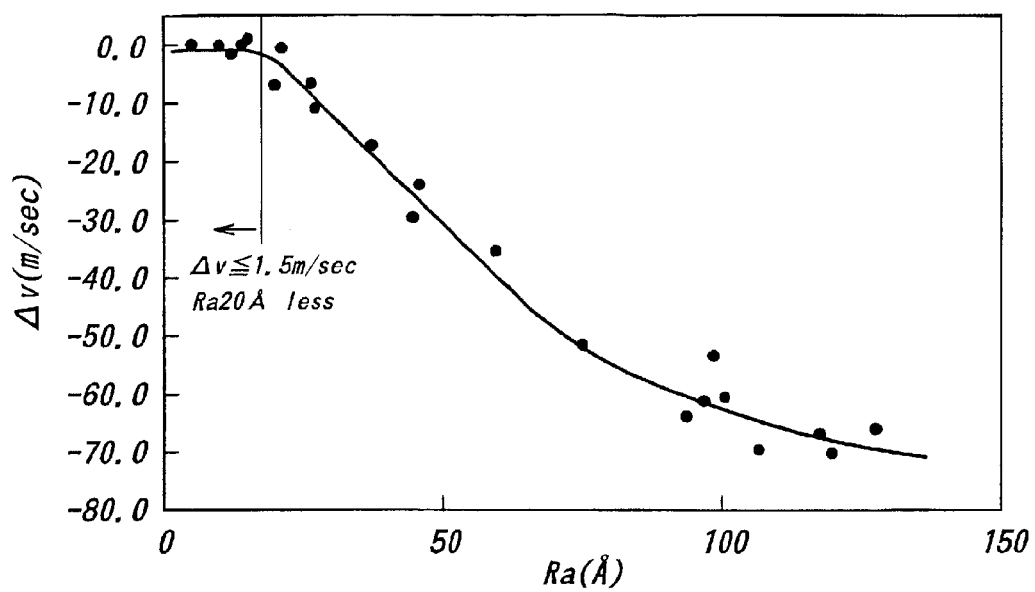
FIG. 5 is a graph showing the relation between the surface flatness of an AlN film and the theoretical propagation velocity of an acoustic surface wave device.

FIG. 5 is a graph showing the relation between the surface flatness of an AlN film and the theoretical propagation velocity of an acoustic surface wave device. The abscissa axis designates the surface flatness Ra (Å) of the AlN film, and the vertical axis designates the deviation Δv (m/sec) from the theoretical propagation velocity of an acoustic surface wave. If the surface flatness Ra is beyond 20 Å, the deviation Δv is remarkably increased. Therefore, in the present invention, the surface flatness Ra is set to 20 Å or below. In this case, the deviation Δv can be reduced to 1.5 m/sec or below. Therefore, the substrate with such an AlN film as having the above range surface flatness can be used for a practical acoustic surface wave device.

Herein, as mentioned above, it is desired that the main surface of the base material made of the C-faced sapphire single crystal on which the AlN film is formed is nitrided, to form a surface nitride layer at the main surface, and then, the AlN film is formed on the main surface via the surface nitride layer. In this case, the crystallinity of the AlN film 23 can be easily developed. Moreover, no cracks are created in the AlN film even though the thickness of the AlN film is increased to 3 µm of the upper limit value within the thickness range as mentioned above. As a result, from the synergy effect of the development in crystallinity and the increase in thickness, the crystallinity of the AlN film can be easily developed to 90 arcsec or over, particularly 60 arcsec or below in X-ray rocking curve.

The nitriding treatment is carried out as follows. First of all, the base material 21 made of the C-faced sapphire single crystal is disposed in nitrogen-including atmosphere composed of ammonia gas. Then, the base material 21 is heated to a given temperature, to form a surface nitride layer at the main surface of the base material 21 through the nitriding reaction. Since the thickness of the surface nitride layer depends on the nitrogen concentration, the nitriding temperature, the nitriding period or the like, it is determined to a given value by controlling their conditions appropriately.

It is desired that the surface nitride layer is formed thinner, for example, in a thickness of 1 nm or below. It is also desired that the surface nitride layer is formed thicker, for example, so that the nitrogen concentration at a 1 nm depth from the main surface of the base material 21 is set to two atomic percentages or over.

Figure 6:
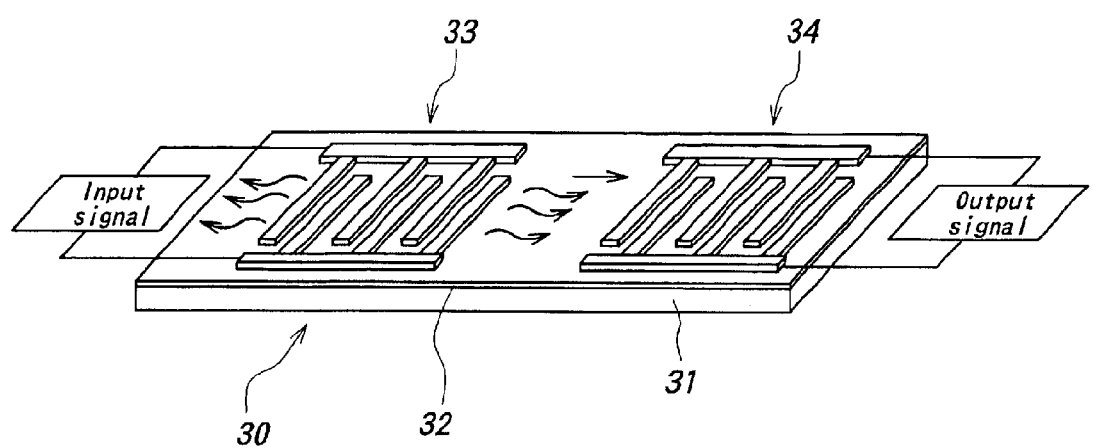
FIG. 6 is a perspective view schematically showing an acoustic surface wave device according to the present invention.

FIG. 6 is a perspective view schematically showing an acoustic surface wave device according to the present invention. In FIG. 6, the acoustic surface wave device of fundamental configuration is depicted. However, the acoustic surface wave device may have various configuration. In FIG. 6, a substrate 30 for an acoustic surface wave device is composed of a base material 31 made of C-faced sapphire single crystal and an AlN film 32 formed on the base material. An inter-digital type electrode 33 to constitute an electro-acoustic converter at a transmission side is disposed on the AlN film 32, and an inter digital type electrode 34 to constitute an electro-acoustic converter at a reception side is disposed on the AlN film 32, separated from the electrode 33 by a given distance. In this example, the width of each electrode finger and the distance between the electrode fingers are set to λ/4, and thus, the electrodes 33 and 34 are made in standard type configuration. As mentioned above, in the acoustic surface wave device depicted in FIG. 6, the deviation Δv (m/sec) from the theoretical propagation velocity of an acoustic surface wave can be reduced to 1.5 m/sec or below.

Although the present invention was described in detail with reference to the above example, this invention is not limited to the above disclosure and every kind of variation and modification may be made without departing from the scope of the present invention.

As mentioned above, according to the present invention, a substrate usable for an acoustic surface wave device which is composed of a base material made of C-faced sapphire single crystal and an AlN film, formed on the base material, having good crystallinity of 90 arcsec or below in X-ray rocking curve and good surface flatness of 20 Å or below can be provided. Moreover, if the base material is heated to 1100° C. or over, and the ratio the ratio (V raw material gas/III raw material gas) is set to 800 or below, and the forming pressure is set within a range of 7-17 Torr, the crystallinity of the AlN film can be more developed and the surface flatness of the AlN film is developed without polishing. Moreover, due to the good crystallinity and surface flatness of the AlN film, the deviation Δv (m/sec) from the theoretical propagation velocity of an acoustic surface wave can be reduced to 1.5 m/sec or below. As a result, a desired acoustic surface wave device can be fabricated as designed.

What is claimed is:

1. A substrate usable for an acoustic surface wave device, comprising:

a base material made of C-faced sapphire single crystal; and an AlN film having crytallinity of 90 arcsec or below in fill width at half maximum (FWHM) of X-ray rocking curve and a surface flatness of 20 Å or below which is formed by a metal organic chemical vapor deposition (MOCVD) method using trimethylaluminum and ammonia as raw material gases.

2. A substrate as defined in claim 1, further comprising a surface nitride layer at the main surface of the base material on which the AlN film is formed.

3. An acoustic surface wave device, comprising:

a substrate composed of a base material made of C-faced sapphire single crystal and an AlN film, formed on the base material, having crystallinity of 90 arcsec or below in full width at half maximum (FWHM) of X-ray rocking curve and a surface flatness of 20 Å or below; and inter digital type electrodes.

4. An acoustic surface wave device as defined in claim 3, wherein the substrate includes a surface nitride layer at the main surface of the base material on which the AlN film is formed.

* * * * *

UNITED STATES PATENT AND TRADEMARK OFFICE
CERTIFICATE OF CORRECTION

PATENT NO. : 6,815,867 B2
DATED : November 9, 2004
INVENTOR(S) : Tomohiko Shibata, Yukinori Nakamura and Mitsuhiro Tanaka It is certified that error appears in the above-identified patent and that said Letters Patent is hereby corrected as shown below:

Column 6,
Line 13, change "fill" to -- full --

Signed and Sealed this

Twenty-second Day of February, 2005

JON W. DUDAS
*Director of the United States Patent and Trademark Office*